(12) United States Patent
Minervini

(10) Patent No.: US 7,242,089 B2
(45) Date of Patent: Jul. 10, 2007

(54) MINIATURE SILICON CONDENSER MICROPHONE

(75) Inventor: Anthony D. Minervini, Palos Hills, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 11/112,043

(22) Filed: Apr. 22, 2005

(65) Prior Publication Data

US 2005/0185812 A1 Aug. 25, 2005

Related U.S. Application Data

(62) Division of application No. 09/886,854, filed on Jun. 21, 2001, now Pat. No. 7,166,910.

(60) Provisional application No. 60/253,543, filed on Nov. 28, 2000.

(51) Int. Cl.
*H01L 23/12* (2006.01)
*H04R 9/08* (2006.01)

(52) U.S. Cl. ............ 257/704; 257/724; 381/355; 381/361

(58) Field of Classification Search ............. None
See application file for complete search history.

(56) References Cited

U.S. PATENT DOCUMENTS

| | | | |
|---|---|---|---|
| 4,127,840 A * | 11/1978 | House | 338/4 |
| 4,277,814 A * | 7/1981 | Giachino et al. | 361/283.1 |
| 4,454,440 A * | 6/1984 | Cullen | 310/313 R |
| 4,533,795 A | 8/1985 | Baumhaer, Jr. et al. | |
| 4,628,740 A | 12/1986 | Ueda et al. | |
| 4,737,742 A * | 4/1988 | Takoshima et al. | 333/150 |
| 4,776,019 A | 10/1988 | Miyatake | |
| 4,825,335 A | 4/1989 | Wilner | |
| 4,908,805 A | 3/1990 | Sprenkels et al. | |
| 4,910,840 A | 3/1990 | Sprenkels et al. | |
| 5,101,543 A * | 4/1992 | Cote et al. | 29/25.41 |
| 5,146,435 A | 9/1992 | Bernstein | |
| 5,151,763 A | 9/1992 | Marek et al. | |
| 5,178,015 A * | 1/1993 | Loeppert et al. | 73/718 |
| 5,357,807 A | 10/1994 | Guckel et al. | |
| 5,408,731 A | 4/1995 | Berggvist et al. | |
| 5,449,909 A | 9/1995 | Kaiser et al. | |
| 5,452,268 A | 9/1995 | Bernstein | |
| 5,459,368 A * | 10/1995 | Onishi et al. | 310/313 R |
| 5,477,008 A * | 12/1995 | Pasqualoni et al. | 174/539 |
| 5,490,220 A | 2/1996 | Loeppert | |
| 5,506,919 A | 4/1996 | Roberts | |

(Continued)

FOREIGN PATENT DOCUMENTS

EP 0 077 615 A1 4/1983

(Continued)

*Primary Examiner*—Alonzo Chambliss
(74) *Attorney, Agent, or Firm*—Marshall, Gerstein & Borun LLP

(57) ABSTRACT

A silicon condenser microphone package includes a transducer unit, a substrate, and a cover. The substrate includes an upper surface transducer unit is attached to the upper surface of the substrate and overlaps at least a portion of the recess wherein a back volume of the transducer unit is formed between the transducer unit and the substrate. The cover is placed over the transducer unit and either the cover or the substrate includes an aperture.

29 Claims, 11 Drawing Sheets

U.S. PATENT DOCUMENTS

| | | | |
|---|---|---|---|
| 5,531,787 A | | 7/1996 | Lesinski et al. |
| 5,545,912 A | * | 8/1996 | Ristic et al. ............. 257/417 |
| 5,592,391 A | | 1/1997 | Muyshondt et al. |
| 5,593,926 A | | 1/1997 | Fujihira |
| 5,659,195 A | | 8/1997 | Kaiser et al. |
| 5,712,523 A | * | 1/1998 | Nakashima et al. .... 310/313 R |
| 5,740,261 A | | 4/1998 | Loeppert et al. |
| 5,748,758 A | | 5/1998 | Menasco, Jr. et al. |
| 5,831,262 A | | 11/1998 | Greywall et al. |
| 5,870,482 A | | 2/1999 | Loeppert et al. |
| 5,889,872 A | | 3/1999 | Sooriakumar et al. |
| 5,923,995 A | | 7/1999 | Kao et al. |
| 5,939,968 A | | 8/1999 | Nguyen et al. |
| 6,012,335 A | | 1/2000 | Bashir et al. |
| 6,078,245 A | | 6/2000 | Fritz et al. |
| 6,108,184 A | | 8/2000 | Minervini et al. |
| 6,136,419 A | * | 10/2000 | Fasano et al. ............. 428/210 |
| 6,191,928 B1 | | 2/2001 | Rector et al. |
| 6,282,072 B1 | | 8/2001 | Minervini et al. |
| 6,439,869 B1 | * | 8/2002 | Seng et al. ................ 425/89 |
| 6,522,762 B1 | * | 2/2003 | Mullenborn et al. ........ 381/174 |
| 6,594,369 B1 | * | 7/2003 | Une ............................ 381/174 |
| 6,621,392 B1 | | 9/2003 | Volant et al. |
| 6,781,231 B2 | | 8/2004 | Minervini |
| 2002/0067663 A1 | | 6/2002 | Loeppert et al. |
| 2002/0102004 A1 | | 8/2002 | Minervini |
| 2003/0052404 A1 | | 3/2003 | Thomas |
| 2003/0133588 A1 | | 7/2003 | Pedersen |
| 2004/0032705 A1 | | 2/2004 | Ma |
| 2004/0184632 A1 | | 9/2004 | Minervini |
| 2005/0018864 A1 | | 1/2005 | Minervini |
| 2005/0069164 A1 | | 3/2005 | Muthuswamy et al. |
| 2006/0157841 A1 | | 7/2006 | Minervini |

FOREIGN PATENT DOCUMENTS

| | | |
|---|---|---|
| EP | 0 774 888 A2 | 5/1997 |
| JP | 07-099420 | 4/1995 |
| JP | 09-107192 | 4/1997 |
| JP | 09-318650 | 12/1997 |
| JP | 2000-165999 | 6/2000 |
| JP | 2000-277970 | 10/2000 |
| JP | 2000-316042 | 11/2000 |
| WO | WO-01/19133 A1 | 3/2001 |
| WO | WO-02/15636 A2 | 2/2002 |
| WO | WO-02/45463 A2 | 6/2002 |
| WO | WO-2006/020478 A1 | 2/2006 |
| WO | WO-2006/061058 A1 | 6/2006 |

* cited by examiner

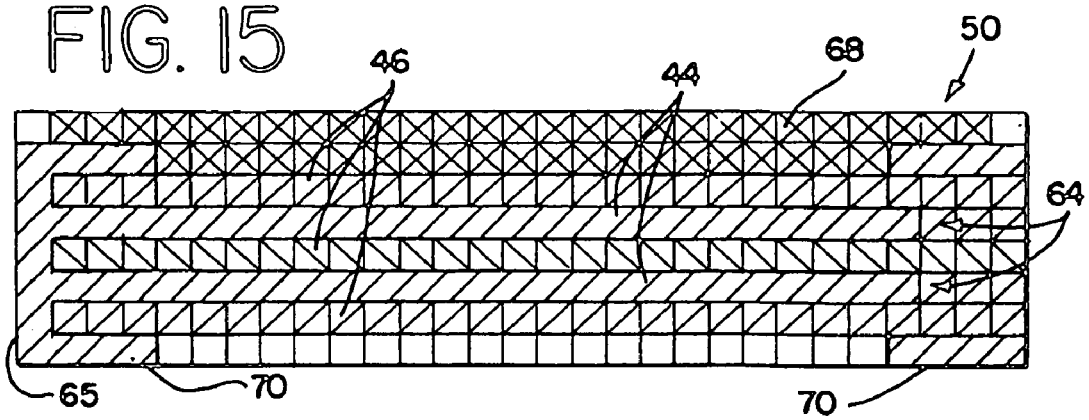
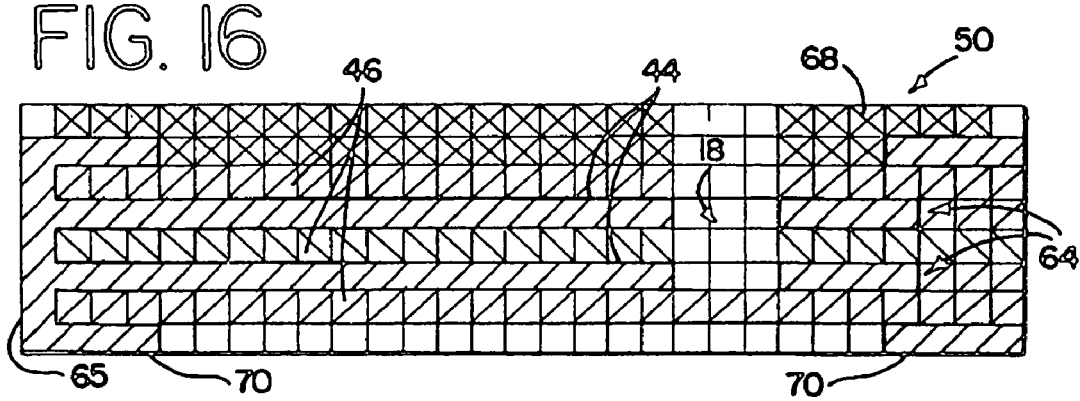
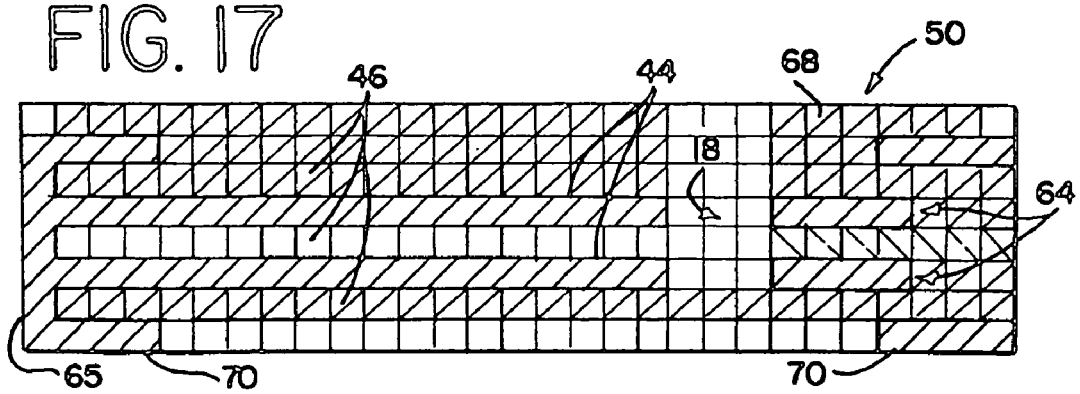
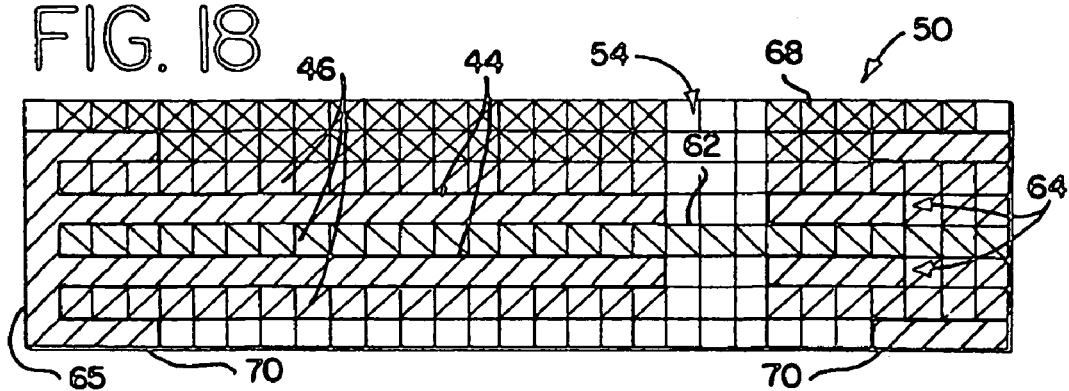

MINIATURE SILICON CONDENSER MICROPHONE

RELATED APPLICATION

This application is a division of U.S. application Ser. No. 09/886,854, filed Jun. 21, 2001, now U.S. Pat. No. 7,166,910, which claims the benefit of Provisional Patent Application Ser. No. 60/253,543 filed Nov. 28, 2000.

TECHNICAL FIELD

The present invention relates generally to a housing for a transducer. More particularly, this invention relates to a miniature silicon condenser microphone comprising a housing for shielding a transducer produced on the surface of a silicon die. The silicon die must be packaged to produce a functional microphone of this type.

BACKGROUND OF THE INVENTION

There have been a number of disclosures related to building microphone elements on the surface of a silicon die. Certain of these disclosures have come in connection with the hearing aid field for the purpose of reducing the size of the hearing aid unit. While these disclosures have reduced the size of the hearing aid, they have not disclosed how to protect the transducer from outside interferences. For instance, transducers of this type are fragile and susceptible to physical damage. Furthermore, they must be protected from light and electromagnetic interferences. Moreover, they require an acoustic pressure reference to function properly. For these reasons, the silicon die must be shielded.

Some shielding practices have been used to house these devices. For instance, insulated metal cans or discs have been provided. Additionally, DIPS and small outline integrated circuit (SOIC) packages have been utilized. However, the drawbacks associated with manufacturing these housings, such as lead time, cost, and tooling, make these options undesirable.

SUMMARY OF THE INVENTION

The present invention is directed to a silicon condenser microphone package which allows acoustic energy to contact a transducer which provides the necessary pressure reference while at the same time protects the transducer from light, electromagnetic interference, and physical damage. A silicon condenser microphone package comprises a transducer, a substrate, and a cover. The substrate has an upper surface with a recess formed therein. The transducer is attached to the upper surface of the substrate and overlaps at least a portion of the recess so that a back volume of the transducer is formed between the transducer and the substrate. The cover is placed over the transducer and includes an aperture adapted for allowing sound waves to reach the silicon condenser transducer.

Other features and advantages of the invention will be apparent from the following specification taken in conjunction with the following drawings.

BRIEF DESCRIPTION OF THE DRAWINGS

FIG. 14b is a plan view of a layer of the laminated bottom portion of FIG. 14a;

FIG. 14c is a plan view of a layer of the laminated bottom portion of FIG. 14a;

FIG. 14d is a plan view of a layer of the laminated bottom portion of FIG. 14a;

FIG. 15 is a cross-sectional view of a bottom portion for a microphone package of the present invention;

FIG. 16 is a cross-sectional view of a bottom portion for a microphone package of the present invention;

FIG. 17 is a cross-sectional view of a bottom portion for a microphone package of the present invention;

FIG. 18 is a cross-sectional view of a bottom portion for a microphone package of the present invention;

DETAILED DESCRIPTION OF THE PREFERRED EMBODIMENTS

Figure 1:
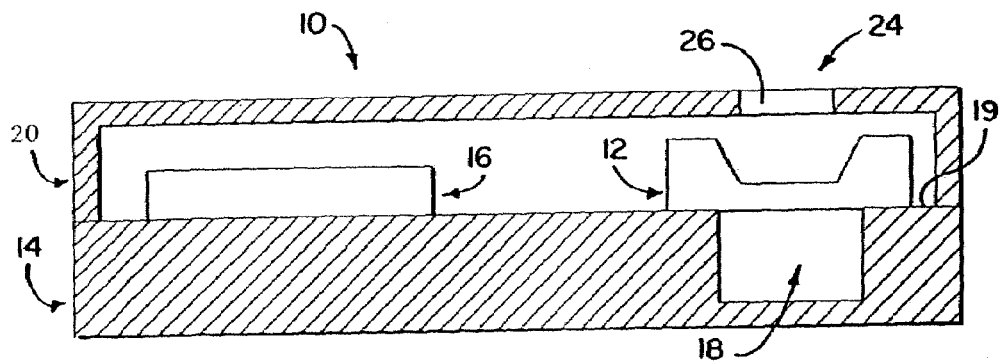
FIG. 1 is a cross-sectional view of a first embodiment of a silicon condenser microphone of the present invention.

While this invention is susceptible of embodiments in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

The present invention is directed to microphone packages. The benefits of the microphone packages disclosed herein over microphone packaging utilizing plastic body/lead frames include the ability to process packages in panel form allowing more units to be formed per operation and at much lower cost. The typical lead frame for a similarly functioning package would contain between 40 and 100 devices connected together. The present disclosure would have approximately 14,000 devices connected together (as a panel). Also, the embodiments disclosed herein require minimal "hard-tooling." This allows the process to adjust to custom layout requirements without having to redesign mold, lead frame, and trim/form tooling.

Moreover, these embodiments have a better match of thermal coefficients of expansion with the end user's PCB since this part would typically be mounted on FR-4 which is the same material used by end users. The present designs may also eliminate the need for wire bonding that is required in plastic body/lead frame packages. The foot print is typically smaller than that would be required for a plastic body/lead frame design since the leads are formed by plating a through-hole in a circuit board of which one half will eventually form the pathway to the solder pad. In a typical plastic body/lead frame design, a gull in which the leads are disposed, widen the overall foot print.

Figure 2:
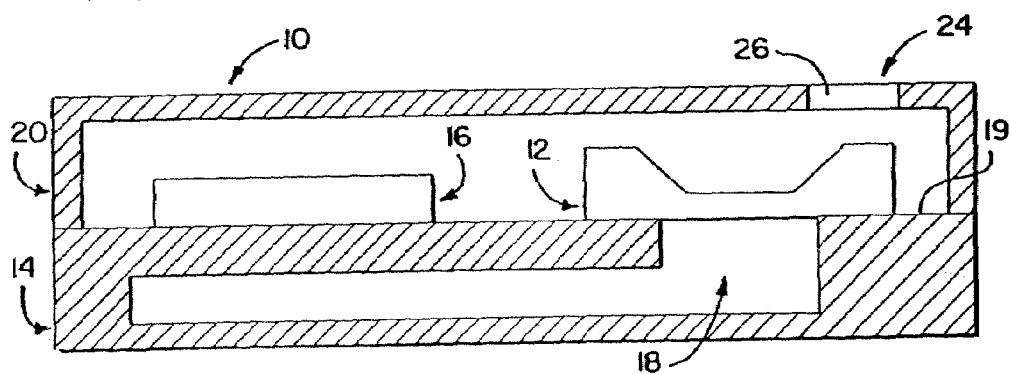
FIG. 2 is a cross-sectional view of a second embodiment of a silicon condenser microphone of the present invention.
Figure 3:
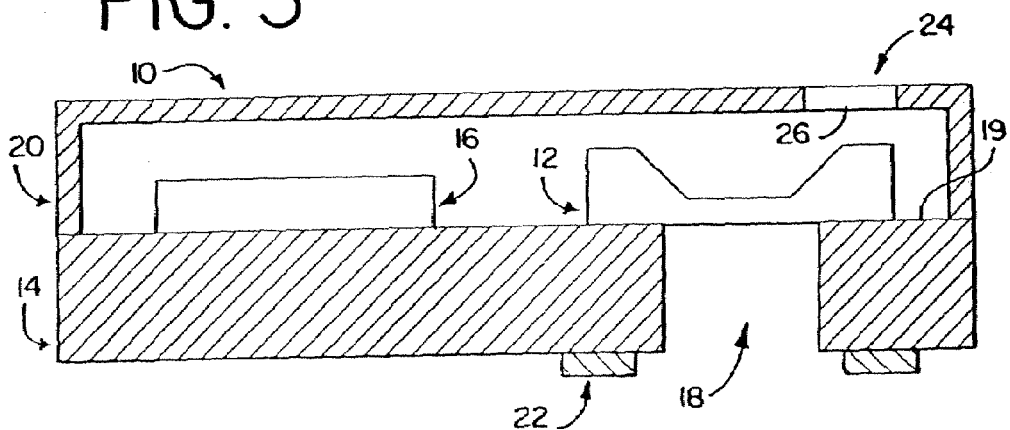
FIG. 3 is a cross-sectional view of a third embodiment of a silicon condenser microphone of the present invention.
Figure 6:
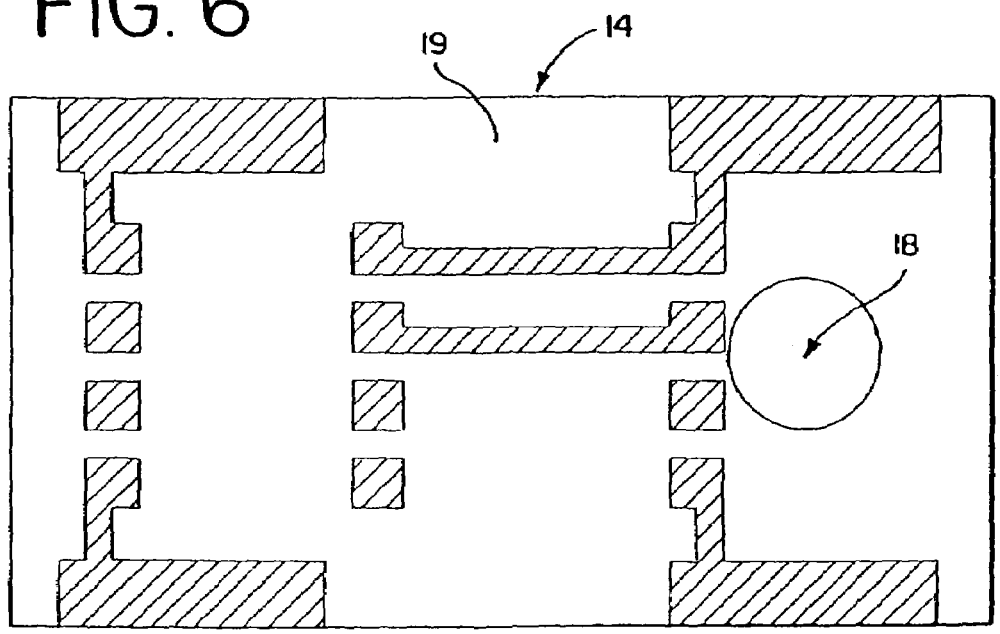
FIG. 6 is a plan view of a substrate to which a silicon condenser microphone is fixed.
Figure 7:
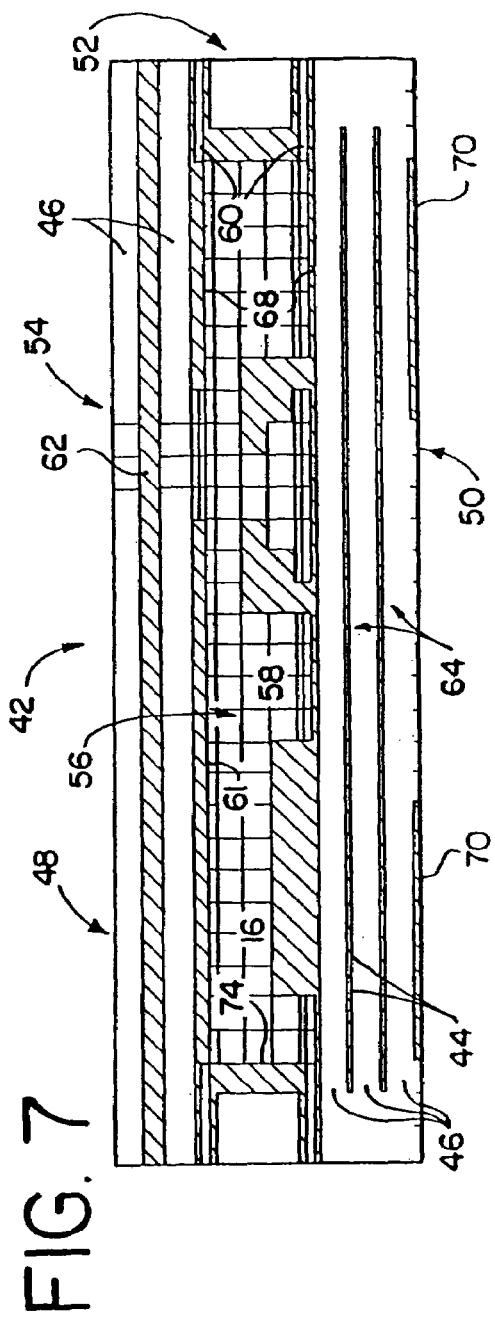
FIG. 7 is a longitudinal cross-sectional view of a microphone package of the present invention.
Figure 8:
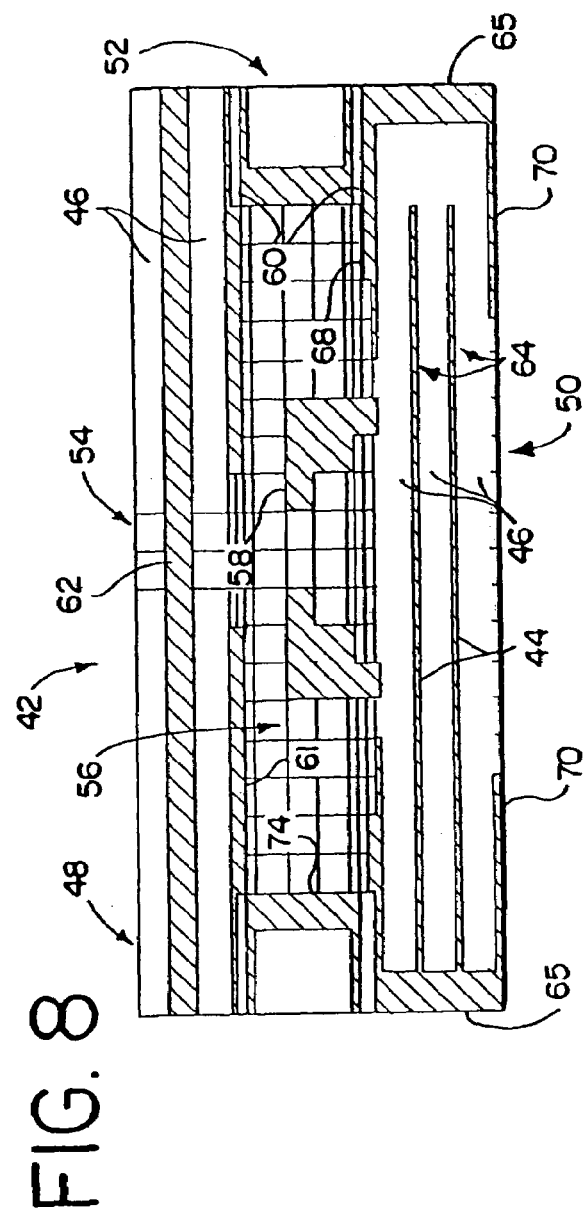
FIG. 8 is a lateral cross-sectional view of a microphone package of the present invention.
Figure 9:
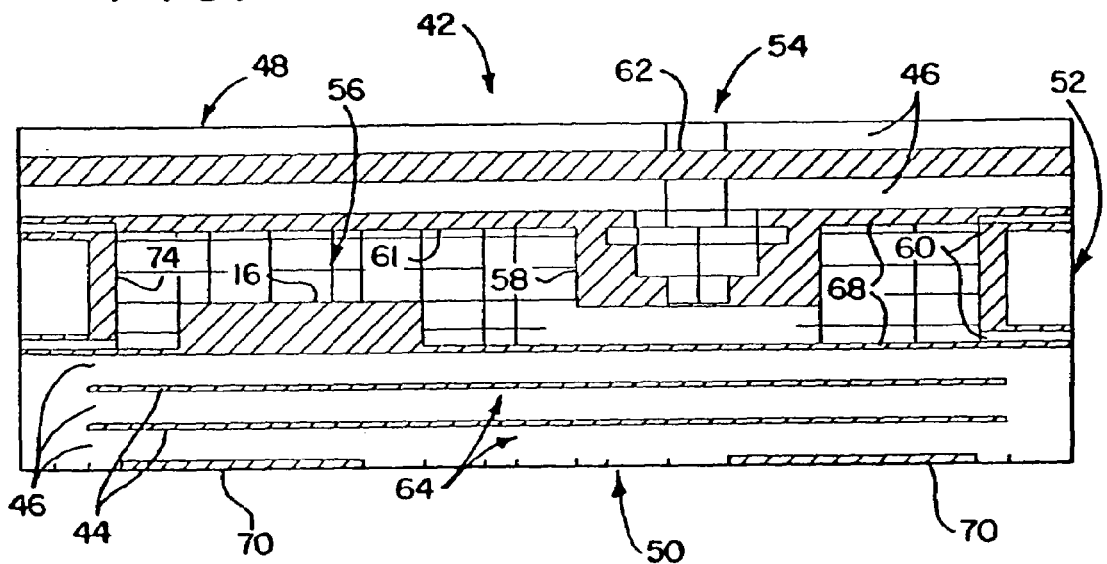
FIG. 9 is a longitudinal cross-sectional view of a microphone package of the present invention.
Figure 10:
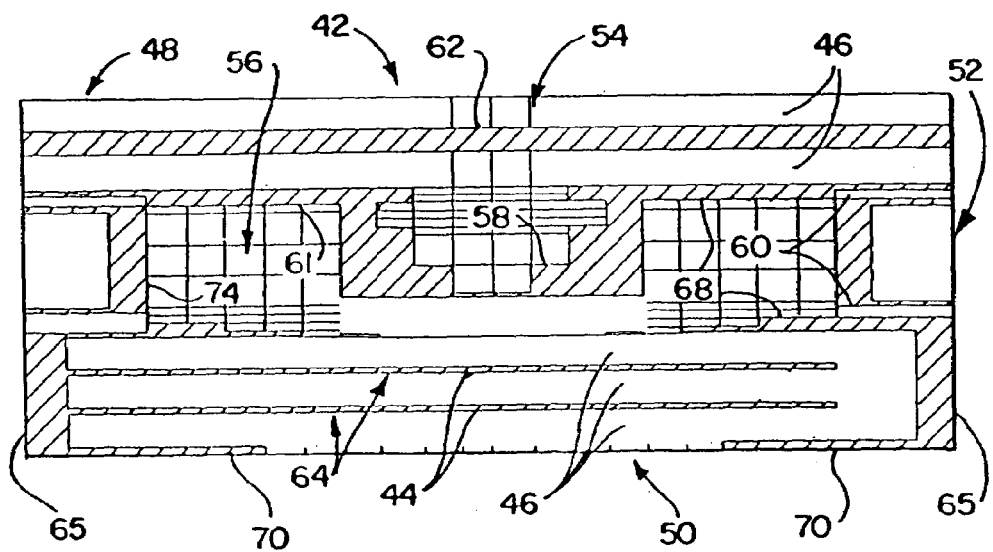
FIG. 10 is a lateral cross-sectional view of a microphone package of the present invention.

Now, referring to FIGS. 1-3, three embodiments of a silicon condenser microphone package 10 are illustrated. The silicon microphone package 10 generally comprises a transducer 12, e.g. a silicon condenser microphone as disclosed in U.S. Pat. No. 5,870,482 which is hereby incorporated by reference, a substrate 14, an amplifier 16, a back volume or air cavity 18 which provides a pressure reference for the transducer 12, and a cover 20. The substrate 14 is typically formed of FR-4 material which may be processed in circuit board panel form, thus taking advantage of economies of scale in manufacturing. FIG. 6 is a plan view of the substrate 14 showing the back volume 18 surrounded a plurality of terminal pads.

Figure 4:
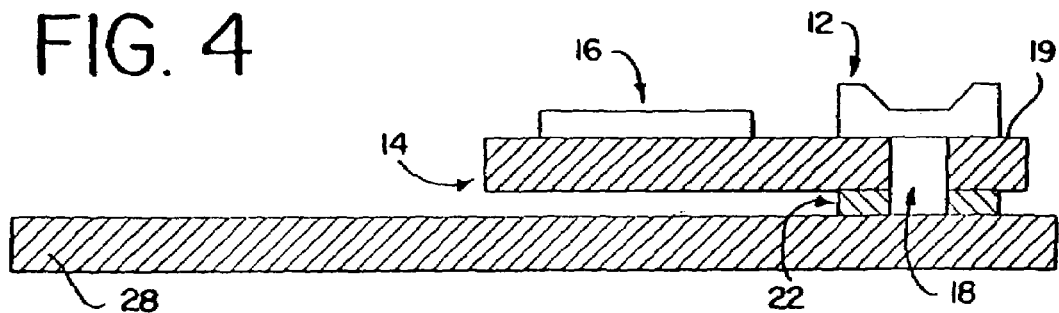
FIG. 4 is a cross-sectional view of the third embodiment of the present invention affixed to an end user circuit board.
Figure 5:
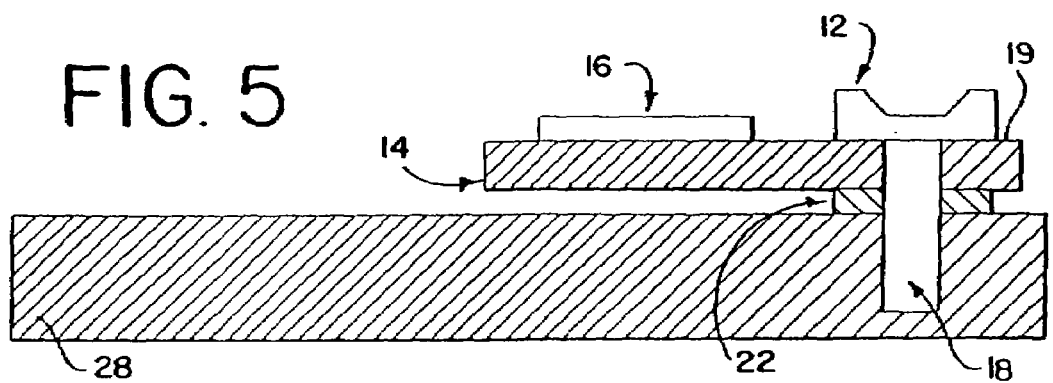
FIG. 5 is a cross-sectional view of the third embodiment of the present invention affixed to an end user circuit board in an alternate fashion.

The back volume 18 may be formed by a number of methods, including controlled depth drilling of an upper surface 19 of the substrate 14 to form a recess over which the silicon condenser microphone is mounted (FIG. 1); drilling and routing of several individual sheets of FR-4 and laminating the individual sheets to form the back volume 18 which may or may not have internal support posts (FIG. 2); or drilling completely through the substrate 14 and providing a sealing ring 22 on the bottom of the device that will seal the back volume 18 during surface mounting to a user's "board" 28 (FIGS. 3-5). In this example, the combination of the substrate and the user's board 28 creates the back volume 18. The back volume 18 is covered by the transducer 12 (MEMS device) which is "bumpbonded" and mounted face down. The boundary is sealed such that the back volume 18 is "air-tight".

The cover 20 is attached for protection and processibility. The cover 20 contains an aperture 24 which may contain a sintered metal insert 26 to prevent water, particles and/or light from entering the package and damaging the internal components inside; i.e. semiconductor chips. The aperture 24 is adapted for allowing sound waves to reach the transducer 12.

Referring to FIGS. 4 and 5, the final form of the product (shown without the cover 20) is a silicon condenser microphone package 10 which would most likely be attached to a end user's PCB 28 via a solder reflow process. FIG. 5 illustrates a method of enlarging the back volume 18 by including a chamber 32 within the end user's circuit board 28.

Another embodiment of a silicon condenser microphone package 40 is illustrated in FIGS. 7-10. In this embodiment, a housing 42 is formed from layers of materials, such as those used in providing circuit boards. Accordingly, the housing 42 generally comprises alternating layers of conductive and non-conductive materials 44, 46. The non-conductive layers 46 are typically FR-4 board. The conductive layers 44 are typically copper.

In the embodiment illustrated, the housing 42 includes a top portion 48 and a bottom portion 50 spaced by a side portion 52. The housing 42 further includes an aperture or acoustic port 54 for receiving an acoustic signal and an inner chamber 56 which is adapted for housing a transducer unit 58, typically a silicon die microphone or a ball grid array package (BGA). The top, bottom, and side portions 48, 50, 52 are electrically connected, for example with a conductive adhesive 60. Each portion may comprise alternating conductive and non-conductive layers of 44, 46.

The chamber 56 includes an inner lining 61. The inner lining 61 is primarily formed by conductive material. It should be understood that the inner lining may include portions of non-conductive material, as the conductive material may not fully cover the non-conductive material. The inner lining 61 protects the transducer 58 against electromagnetic interference and the like, much like a faraday cage.

In the various embodiments illustrated in FIGS. 7-10 and 23-26, the portions of the housing 42 that include the aperture or acoustic port 54 further include a layer of material that forms an environmental barrier 62 over or within the aperture 54. This environmental barrier 62 is typically a polymeric material formed to a film, such as a polytetrafluoroethylene (PTFE) or a sintered metal. The environmental barrier 62 is supplied for protecting the chamber 56 of the housing 42, consequently, the transducer unit 58 within the housing 42, from environmental elements such as sunlight, moisture, oil, dirt, and/or dust.

The environmental barrier layer 62 is generally sealed between two layers of conductive material 44. When the environmental barrier layer 62 is sandwiched between two layers of conductive material 44, it may act as a capacitor (with electrodes defined by the metal) that can be used to filter input and output signals or the input power. The environmental barrier layer 62 may further serve as a dielectric protective layer when in contact with the conductive layers 44 in the event that the conductive layers also contain thin film passive devices such as resistors and capacitors.

In addition to protecting the chamber 56 from environmental elements, the barrier layer 62 allows subsequent wet processing, board washing of the external portions of the housing 42, and electrical connection to ground from the walls via thru hole plating. The environmental barrier layer 62 also allows the order of manufacturing steps in the fabrication of the printed circuit board-based package to be modified. This advantage can be used to accommodate different termination styles. For example, a double sided package can be fabricated having a pair of apertures 54 (see FIG. 25), both including an environmental barrier layer 62. The package would look and act the same whether it is mounted face up or face down, or the package could be mounted to provide directional microphone characteristics.

Figure 11:
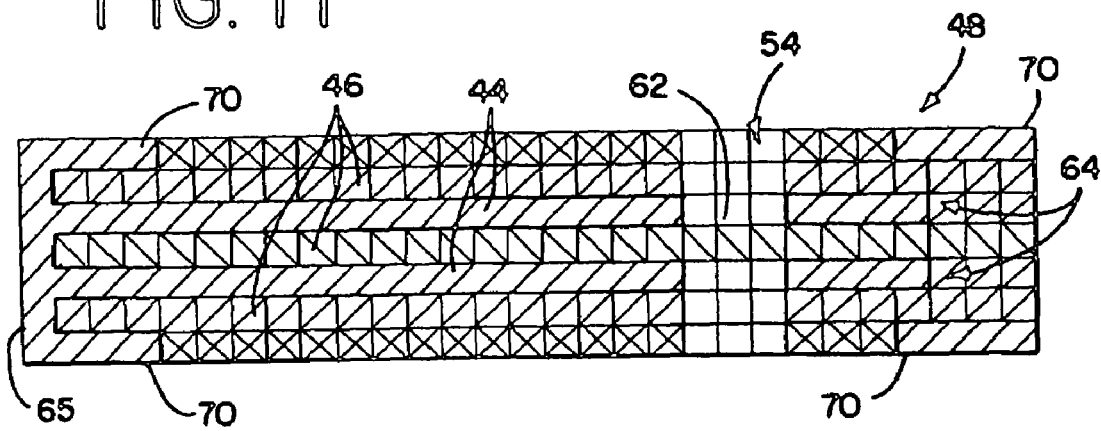
FIG. 11 is a cross-sectional view of a top portion for a microphone package of the present invention.
Figure 12:
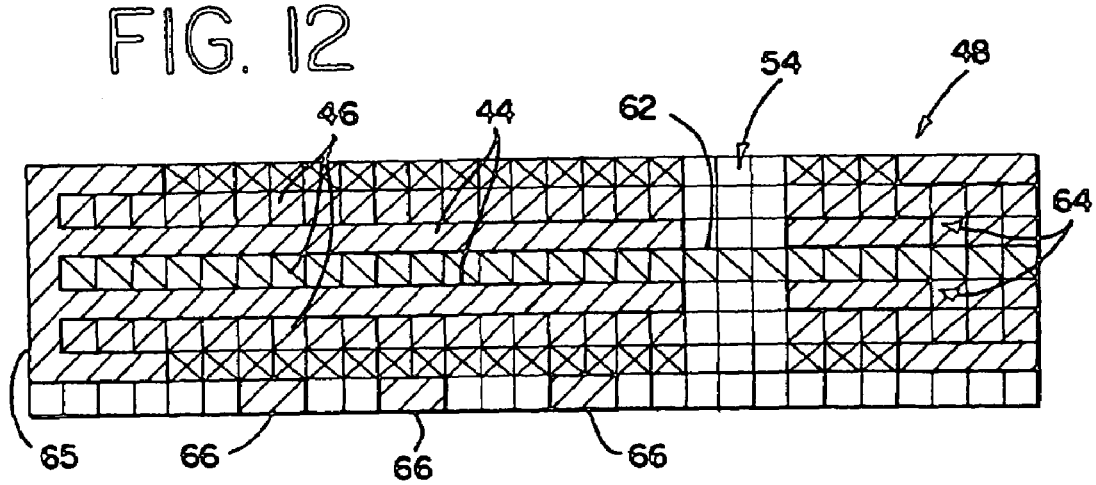
FIG. 12 is a cross-sectional view of a top portion for a microphone package of the present invention.
Figure 13:
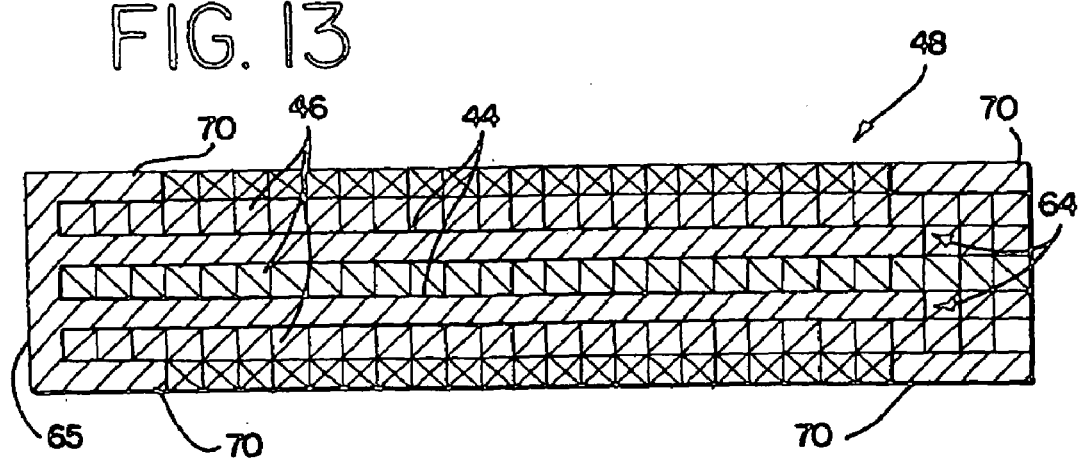
FIG. 13 is a cross-sectional view of a top portion for a microphone package of the present invention.

Referring to FIGS. 7, 8, and 11-13, the transducer unit 58 is generally not mounted to the top portion 48 of the housing. This definition is independent of the final mounting orientation to an end user's circuit board. It is possible for the top portion 48 to be mounted face down depending on the orientation of the transducer 58 as well as the choice for the bottom portion 50. The conductive layers 44 of the top portion 48 may be patterned to form circuitry, ground planes, solder pads, ground pads, and plated through hole pads. Referring to FIGS. 11-13, there may be additional alternating conductive layers 44, non-conductive layers 46, and environmental protective membranes 62 as the package requires. Alternatively, some layers may be deliberately excluded as well. The first non-conductive layer 46 may be patterned so as to selectively expose certain features on the first conductive layer 44.

FIG. 11 illustrates an alternative top portion 48 for a microphone package. In this embodiment, a connection between the layers can be formed to provide a conduit to ground. The top portion of FIG. 11 includes ground planes and/or pattern circuitry 64 and the environmental barrier 62. The ground planes and or pattern circuitry 64 are connected by pins 65.

FIG. 12 illustrates another embodiment of a top portion 48. In addition to the connection between layers, ground planes/pattern circuitry 64, and the environmental barrier 62, this embodiment includes conductive bumps 66 (e.g. Pb/Sn or Ni/Au) patterned on the bottom side to allow secondary electrical contact to the transducer 58. Here, conductive circuitry would be patterned such that electrical connection between the bumps 66 and a plated through hole termination is made.

FIG. 13 illustrates yet another embodiment of the top portion 48. In this embodiment, the top portion 48 does not include an aperture or acoustic port 54.

Referring to FIGS. 7, 8 and 14-18, the bottom portion 50 is the component of the package to which the transducer 58 is primarily mounted. This definition is independent of the final mounting orientation to the end user's circuit board. It is possible for the bottom portion 50 to be mounted facing upwardly depending on the mounting orientation of the transducer 58 as well as the choice for the top portion 48 construction. Like the top portion 48, the conductive layers 44 of the bottom portion 50 may be patterned to form circuitry, ground planes, solder pads, ground pads and plated through hole pads. As shown in FIGS. 14-18, there may be additional alternating conductive layers 44, non-conductive layers 46, and environmental protective membranes 62 as the package requires. Alternatively, some layers may be deliberately excluded as well. The first non-conductive layer 46 may be patterned so as to selectively expose certain features on the first conductive layer 44.

Figure 14A:
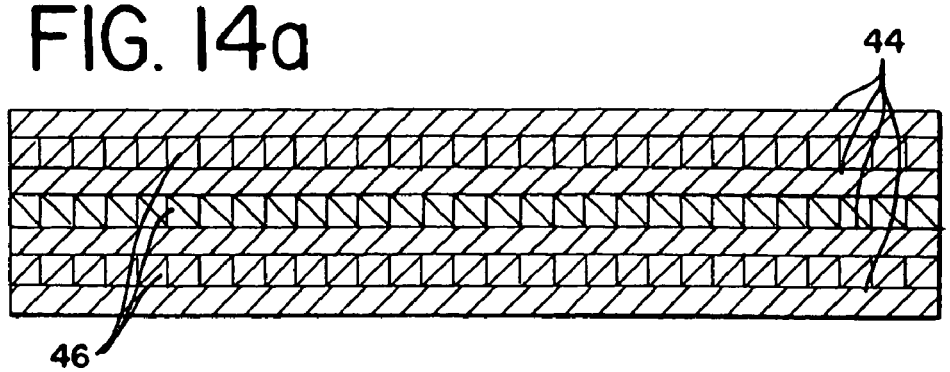
FIG. 14a is a cross-sectional view of a laminated bottom portion of a housing for a microphone package of the present invention.
Figure 14B:
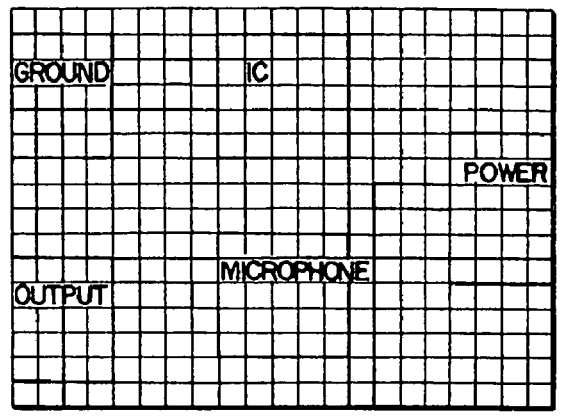

Referring to FIGS. 14a through 14d, the bottom portion 50 comprises a laminated, multi-layered board including layers of conductive material 44 deposited on layers of non-conductive material 46. Referring to FIG. 14b, the first layer of conductive material is used to attach wire bonds or flip chip bonds. This layer includes etched portions to define lead pads, bond pads, and ground pads. The pads would have holes drilled through them to allow the formation of plated through-holes.

Figure 14C:
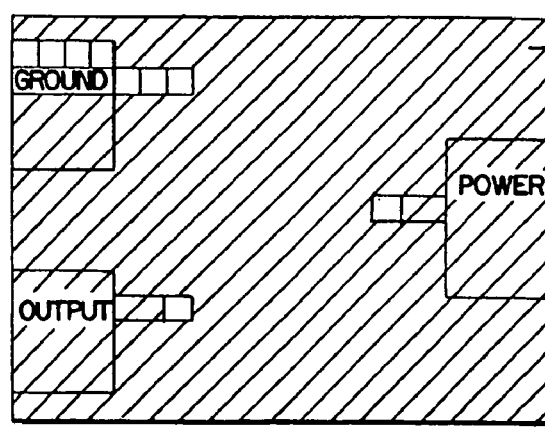

As shown in FIG. 14c, a dry film 68 of non-conductive material covers the conductive material. This illustration shows the exposed bonding pads as well as an exposed ground pad. The exposed ground pad would come in electrical contact with the conductive epoxy and form the connection to ground of the side portion 52 and the base portion 50.

Figure 14D:
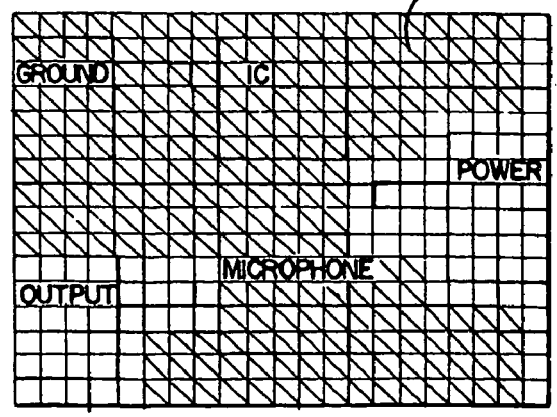

Referring to FIG. 14d, ground layers can be embedded within the base portion 50. The hatched area represents a typical ground plane 64. The ground planes do not overlap the power or output pads, but will overlap the transducer 58.

Referring to FIG. 15, an embodiment of the bottom portion 50 is illustrated. The bottom portion 50 of this embodiment includes a solder mask layer 68 and alternating layers of conductive and non-conductive material 44, 46. The bottom portion further comprises solder pads 70 for electrical connection to an end user's board.

FIGS. 16 and 17 illustrate embodiments of the bottom portion 50 with enlarged back volumes 18. These embodiments illustrate formation of the back volume 18 using the conductive/non-conductive layering.

FIG. 18 shows yet another embodiment of the bottom portion 50. In this embodiment, the back portion 50 includes the acoustic port 54 and the environmental barrier 62.

Referring to FIGS. 7-10 and 19-22, the side portion 52 is the component of the package that joins the bottom portion 50 and the top portion 48. The side portion 51 may include a single layer of a non-conductive material 46 sandwiched between two layers of conducive material 44. The side portion 48 forms the internal height of the chamber 56 that houses the transducer 58. The side portion 52 is generally formed by one or more layers of circuit board material, each having a routed window 72 (see FIG. 18).

Figure 19:
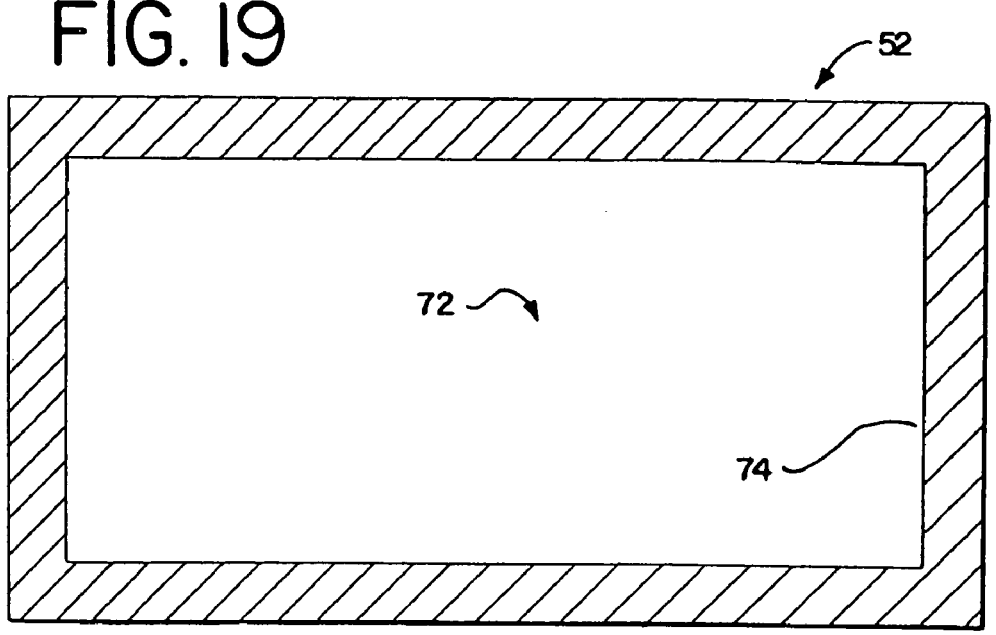
FIG. 19 is a plan view of a side portion for a microphone package of the present invention.
Figure 20:
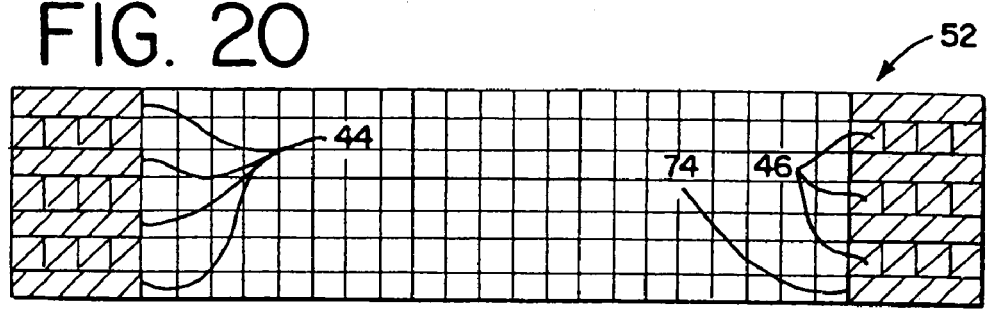
FIG. 20 is a cross-sectional package view of a side portion for a microphone package of the present invention.
Figure 21:
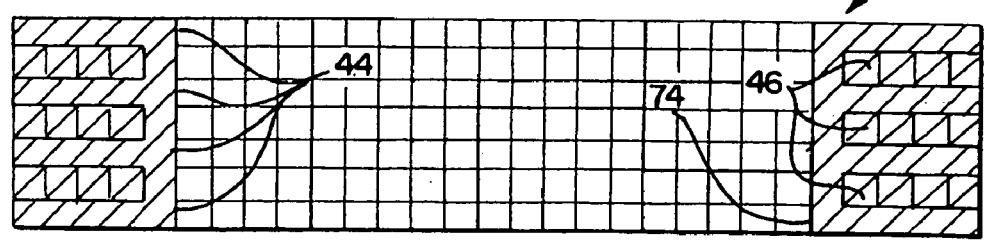
FIG. 21 is a cross-sectional view of a side portion for a microphone package of the present invention.
Figure 22:
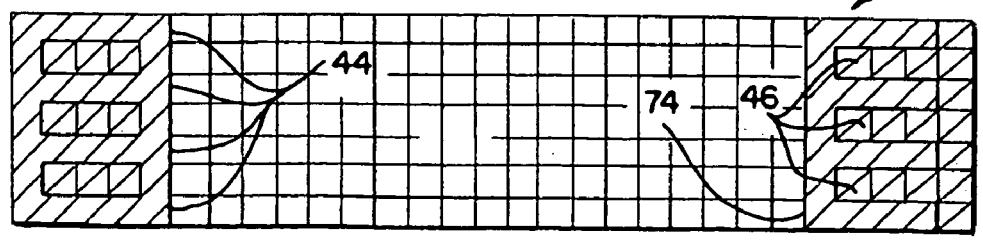
FIG. 22 is a cross-sectional view of a side portion for a microphone package of the present invention.

Referring to FIGS. 19-22, the side portion 52 includes inner side wall 74. The inner side walls 74 are generally plated with a conductive material, typically copper, as shown in FIGS. 20 and 21. The side wall 74 are formed by the outer perimeter of me routed window 72 and coated/metallized with a conductive material.

Alternatively, the side wall 74 may be formed by many alternating layers of non-conductive material 46 and conductive material 44, each having a routed window 72 (see FIG. 19). In this case, the outer perimeter of the window 72 may not require coverage with a conductive material because the layers of conductive material 44 would provide effective shielding.

FIGS. 23-26 illustrate various embodiments of the microphone package 40. These embodiments utilize top, bottom, and side portions 48, 50, and 52 which are described above. It is contemplated that each of the top, bottom, and side portion 48, 50, 52 embodiments described above can be utilized in any combination without departing from the invention disclosed and described herein.

Figure 23:
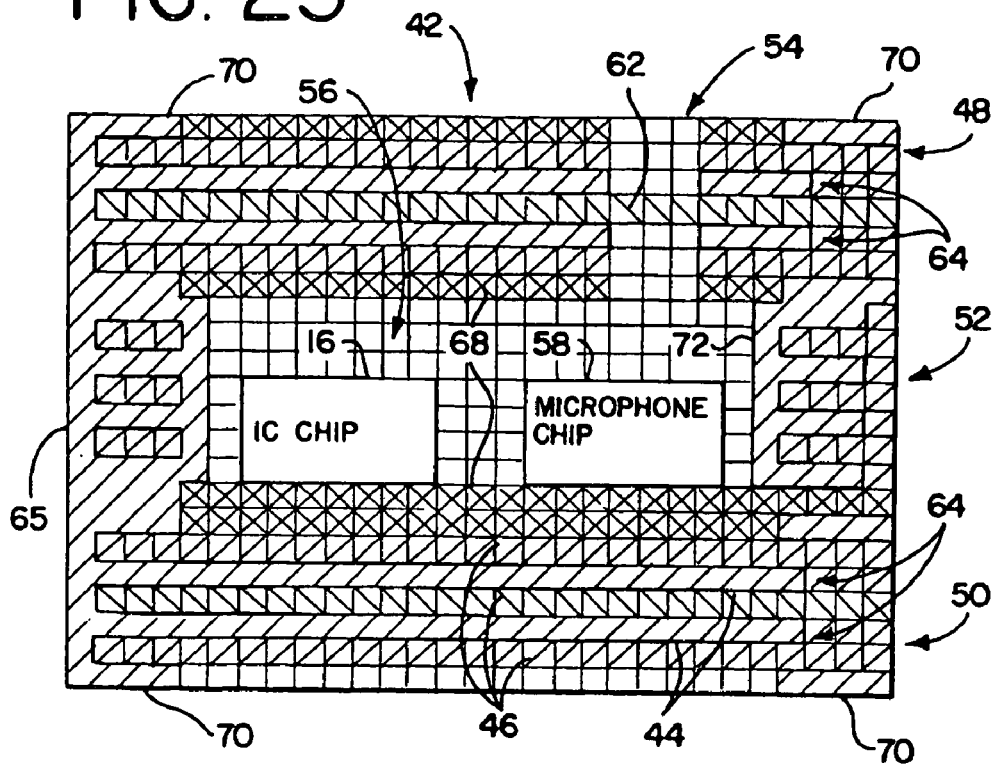
FIG. 23 is a cross-sectional view of a microphone package of the present invention.

In FIG. 23, connection to an end user's board is made through the bottom portion 50. The package mounting orientation is bottom portion 50 down connection from the transducer 58 to the plated through holes is be made by wire bonding. The transducer back volume 18 is formed by the back hole (mounted down) of the silicon microphone only. Bond pads, wire bonds and traces to the terminals are not shown. A person of ordinary skilled in the art of PCB design will understand that the traces reside on the first conductor layer 44. The wire bonds from the transducer 58 are be connected to exposed pads. The pads are connected to the solder pads via plated through holes and traces on the surface.

Figure 24:
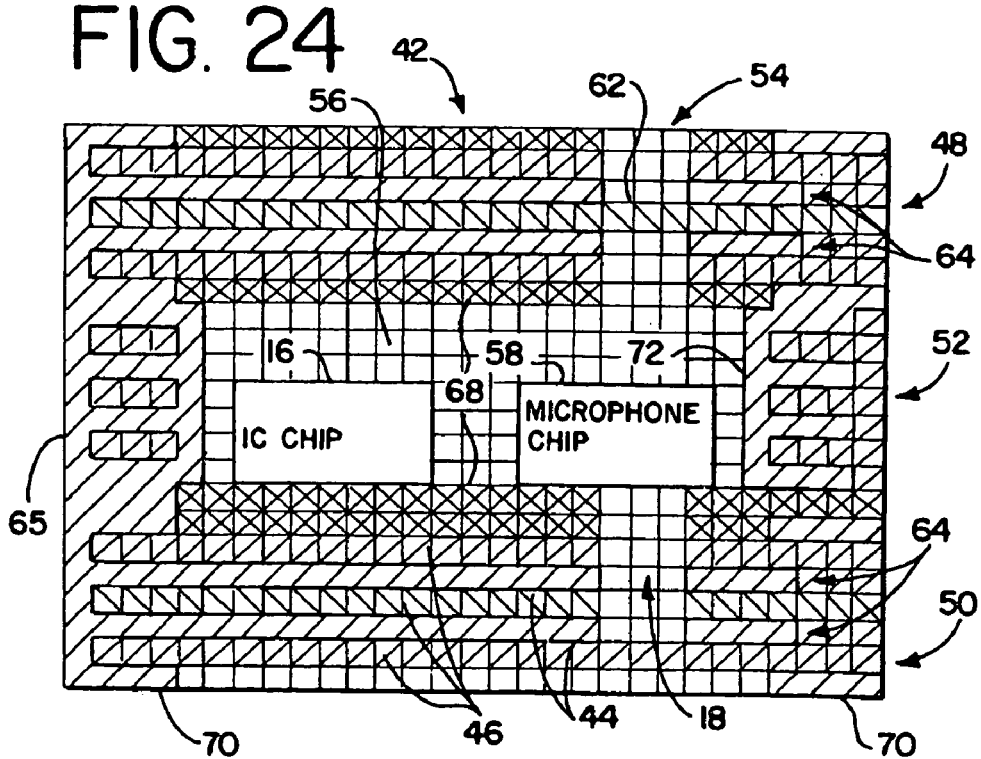
FIG. 24 is a cross-sectional view of a microphone package of the present invention.

In FIG. 24, connection to the end user's board is also made through the bottom portion 50. Again, the package mounting orientation is bottom portion 50 connection from the transducer 58 to the plated through holes are made by wire bonding. The back volume 18 is formed by a combination of the back hole of the transducer 58 (mounted down) and the bottom portion 50.

Figure 25:
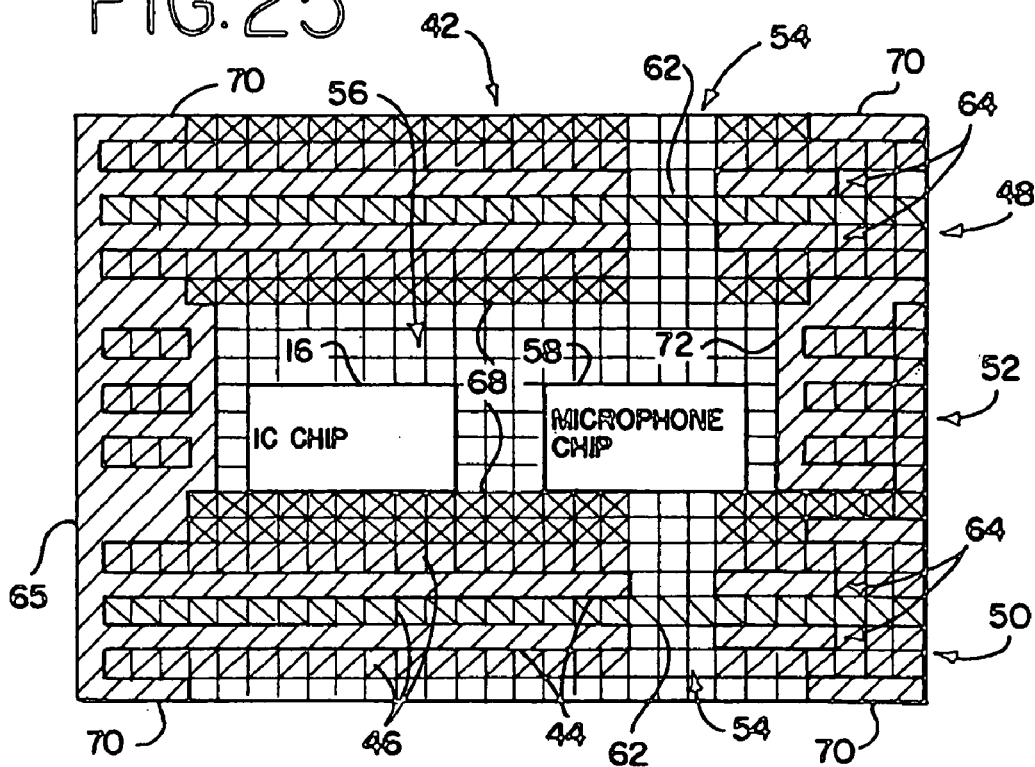
FIG. 25 is across-sectional view of a microphone package of the present invention.

In FIG. 25, connection to the end user's board is also made through the bottom portion 50. Again, the package mounting orientation is bottom portion 50 connection from the transducer 58 to the plated through holes are made by wire bonding. With acoustic ports 54 on both sides of the package, there is no back volume, This method is suitable to a directional microphone.

Figure 26:
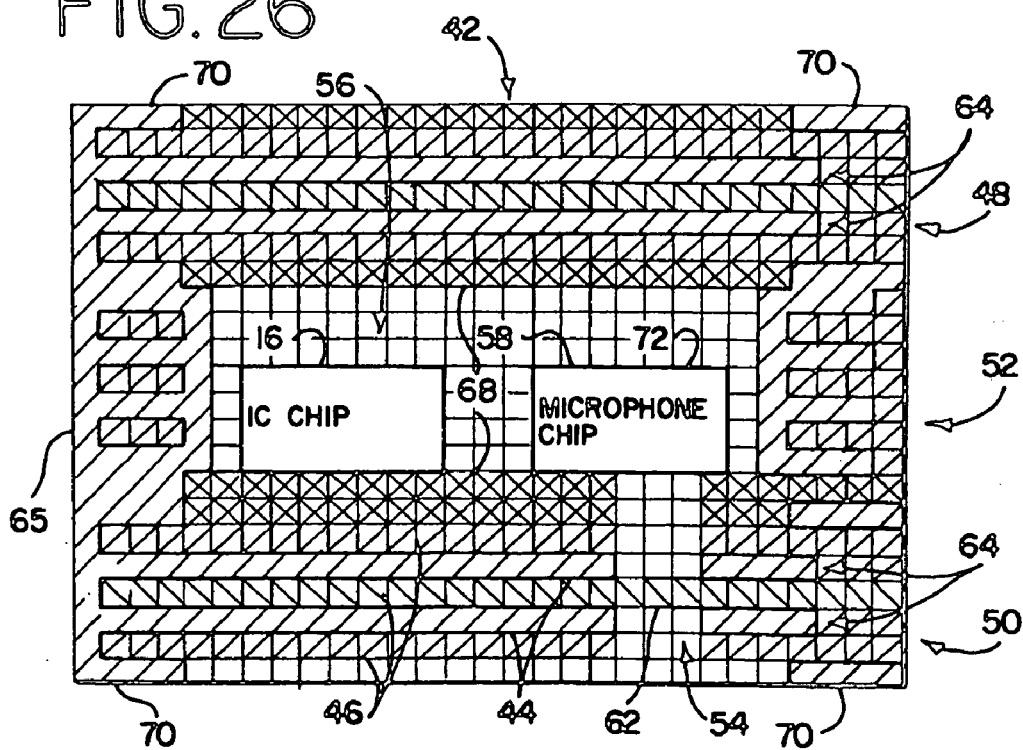
FIG. 26 is a cross-sectional view of a microphone package of the present invention.

In FIG. 26, connection to the end user's board is made through the top portion 48 of the bottom portion 50. The package mounting orientation is either top portion 48 down or bottom portion 50 down. Connection from the transducer 58 to the plated through holes is made by flip chipping and trace routing. The back volume 18 is formed by using the air cavity created by laminating the bottom portion 50 and the top portion 48 together. Some portion of the package fabrication is performed after the transducer 58 has been attached. In particular, the through hole formation, plating, and solder pad definition would be done after the transducer 58 is attached. The protective membrane 62 is hydrophobic and prevents corrosive plating chemistry from entering the chamber 56.

Figure 27:
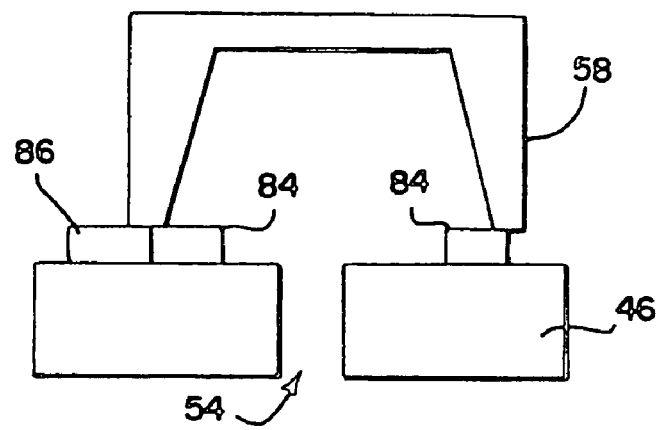
FIG. 27 is a cross-sectional view of a microphone package of the present invention with a retaining ring.
Figure 28:
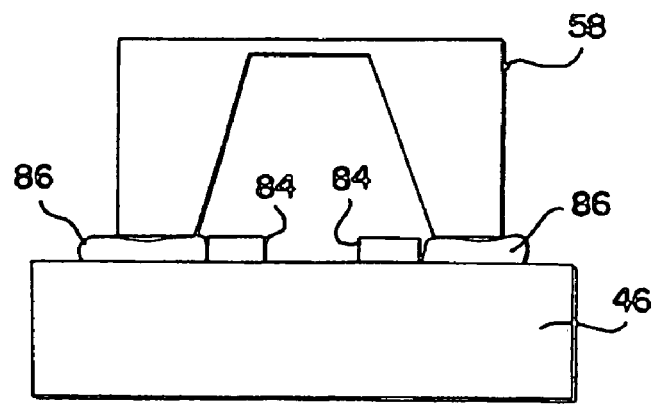
FIG. 28 is a cross-sectional view of a microphone package of the present invention with a retaining wing.
Figure 29:
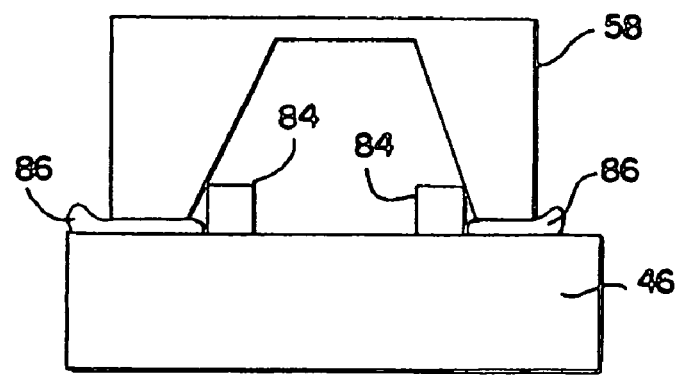
FIG. 29 is a cross-sectional view of a microphone package of the present invention with a retaining ring.

Referring to FIGS. 27-29, the portion to which the transducer unit 58 is mounted may include a retaining ring 84. The retaining ring 84 prevents wicking of an epoxy 86 into the transducer 58 and from flowing into the acoustic port or aperture 54. Accordingly, the shape of the retaining ring 84 will typically match the shape of the transducer 58 foot print. The retaining ring 84 comprises a conductive material (e.g., 3 mil. thick copper) imaged on a non-conductive layer material.

Referring to FIG. 27, the retaining ring 84 is imaged onto a non-conductive layer. An epoxy is applied outside the perimeter of the retaining ring 84, and the transducer 58 is added so that it overlaps the epoxy 86 and the retaining ring 84. This reduces epoxy 86 wicking up the sides of the transducer's 58 etched port (in the case of a silicon die microphone).

Alternatively, referring to FIG. 28, the retaining ring 84 can be located so that the transducer 58 does not contact the retaining ring 84. In this embodiment, the retaining ring 84 is slightly smaller than the foot print of the transducer 58 so that the epoxy 86 has a restricted path and is, thus, less likely to wick. In FIG. 29, the retaining ring 84 is fabricated so that it contacts the etched port of the transducer 58.

The following tables provide an illustrative example of a typical circuit board processing technique for fabrication of the housing of this embodiment.

TABLE 1

| Material | Type | Component | Note |
|---|---|---|---|
| 1 | 0.5/0.5 oz. DST Cu 5 core FR-4 | Bottom Portion (Conductive Layers 1 and 2; Non-Conductive Layer 1) | |
| 2 | 0.5/0.5 oz. DST Cu 5 core FR-4 | Bottom Portion (Conductive Layers 3 and 4; Non-Conductive Layer 2) | |
| 3 | 106 pre-preg | | For Laminating Material 1 and Material 2 |
| 4 | 0.5/0.5 oz. DST Cu 40 Core FR-4 | Side Portion | Metallized Afterward |
| 5 | Bare/0.5 oz. Cu 2 core FR-4 (2 pieces) | Top Portion (Each Piece Includes 1 Conductive and 1 Non-Conductive Layer) | |
| 6 | Expanded PTFE | Environmental Barrier | |

TABLE 2: Processing of Materials (Base Portion Material 1)

| Step | Type | Description | Note |
|---|---|---|---|
| 1 | Dry Film Conductive Layers | | |
| 2 | Expose | Mask Material 1 (Lower Conductive Layer). | Forms Ground Plane on Lower Conductive Layer |
| 3 | Develop | | |
| 4 | Etch Cu | | No Etching on Upper Conductive Layer |
| 5 | Strip Dry Film | | |

TABLE 3

Processing of Materials (Bottom Portion Material 2)

| Step | Type | Description | Note |
|---|---|---|---|
| 1 | Dry Film Conductive Layers | | |
| 2 | Expose | Mask Material 2 (Upper Conductive Layer) | Forms Ground Plane on Upper Conductive Layer |
| 3 | Develop | | |
| 4 | Etch Cu | | No Etching on Lower Conductive Layer |
| 5 | Strip Dry Film | | |

TABLE 4

Processing of Materials 1, 2, and 3 (Form Bottom Portion)

| Step | Type | Description | Note |
|---|---|---|---|
| 1 | Laminate | Materials 1 and 2 Laminated Using Material 3 | |
| 2 | Drill Thru Holes | Drill Bit = 0.025 in. | |
| 3 | Direct Metallization/Flash Copper | Plates Thru Holes | |
| 4 | Dry Film (L1 and L4) | | |
| 5 | Expose | Mask Laminated Materials 1 and 2 (Upper and Lower Conductive Layers) | Forms Traces and Solder Pads |
| 6 | Develop | | |

TABLE 4-continued

Processing of Materials 1, 2, and 3 (Form Bottom Portion)

| Step | Type | Description | Note |
|---|---|---|---|
| 7 | Electrolytic Cu | 1.0 mil | |
| 8 | Electrolytic Sn | As Required | |
| 9 | Strip Dry Film | | |
| 10 | Etch Cu | | |
| 11 | Etch Sn | | |
| 12 | Insert Finishing Option Here | NG Option (See Table Below) | NG Option for Proof of Principle |
| 13 | Dry Film (cover lay) on Upper Conductive Layer Only | 2.5 mil | Minimum Thickness on Upper Conductive Layer |
| 14 | Expose | Mask Laminated Materials 1 and 2 (upper and lower) | This mask defines an area on the upper conductive layer that will receive a dry film solder mask (cover lay). The bottom layer will not have dry film applied to it. The plated through holes will be bridged over by the coating on the top. |
| 15 | Develop | | |
| 16 | Cure | | Full Cure |
| 17 | Route Panels | Route Bit = As Required | Forms 4" × 4" pieces. Conforms to finished dims |

Table 5 describes the formation of the side portion 52. This process involves routing a matrix of openings in FR-4 board. However, punching is thought to be the cost effective method for manufacturing. The punching may done by punching through the entire core, or, alternatively, punching several layers of no-flow pre-preg and thin core c-stage which are then laminated to form the wall of proper thickness.

After routing the matrix, the board will have to be electroless or DM plated. Finally, the boards will have to be routed to match the bottom portion. This step can be done first or last. It may make the piece more workable to perform the final routing as a first step.

TABLE 5

Processing of Material 4 (Side Portion)

| Step | Type | Description | Note |
|---|---|---|---|
| 1 | Route./Punch Matric of Openings | Route Bit = 0.031 in. | Forms Side Portion |
| 2 | Direct Metallization/ Flash Cu | 0.25 mil minimum | Forms Sidewalls on Side Portion |
| 3 | Route Panels | | |

Table 6 describes the processing of the top portion. The formation of the top portion 48 involves imaging a dry film cover layer or liquid solder mask on the bottom (i.e. conductive layer forming the inner layer. The exposed layer of the top portion 48 will not have a copper coating. It can be processed this way through etching or purchased this way as a one sided laminate.

A matrix of holes is drilled into the lid board. Drilling may occur after the imaging step. If so, then a suitable solder mask must be chosen that can survive the drilling process.

TABLE 6

Processing of Top Portion

| Step | Type | Description | Note |
|---|---|---|---|
| 1 | Dry Film | Conductive Layer | |
| 2 | Expose | Mask Bare Layer | Form Conduction Ring |
| 3 | Develop | | |
| 4 | Cure | | |
| 5 | Drill Matrix of Holes | Drill Bit = 0.025 in. | Acoustic Ports |
| 6 | Laminate | PTFE (Environmental Barrier) Between 2 Pieces of Material 5 | Forms Top Portion |

TABLE 7

Processing of Laminated Materials 1 and 2 with Material 4

| Step | Type | Description | Note |
|---|---|---|---|
| 1 | Screen Conductive Adhesive on Material 4 | | |
| 2 | Laminate | Bottom Portion with Side Portion | Forms Bottom Portion with Side Portion (spacer) |
| 3 | Add Transducer Assembly | Silicon Die Microphone and Integrated Circuit | |

TABLE 8

Processing of Laminated Materials 1, 2, and 4 with Material 5

| Step | Type | Description | Note |
|---|---|---|---|
| 1 | Screen Conductive Adhesive on Top Portion | | |
| 2 | Laminate | Bottom Portion and Side Portion with Top_Portion | Forms Housing |
| 3 | Dice | | |

TABLE 9

Finishing Option NG (Nickel/Gold)

| Step | Type | Description | Note |
|---|---|---|---|
| 1 | Immersion Ni (40-50, μ-in) | | |
| 2 | Immersion Au (25-30, μ-in) | | |

TABLE 10

Finishing Option NGT (Nickel/Gold/Tin)

| Step | Type |
|---|---|
| 1 | Mask L2 (using thick dry film or high tack dicing tape) |
| 2 | Immersion Ni (40-50, μ-in) |
| 3 | Immersion Au (25-30, μ-in) |
| 4 | Remove Mask on L2 |
| 5 | Mask L1 (using thick dry film or high tack dicing tape) bridge over cavity created by wall |
| 6 | Immersion Sn (100-250, μ-in) |
| 7 | Remove Mask on L1 |

TABLE 11

Finishing Option ST (Silver/Tin)

| Step | Type |
|------|------|
| 1 | Mask L2 (using thick dry film or high tack dicing tape) |
| 2 | Immersion Ag (40-50 µ-in) |
| 3 | Remove Mask on L2 |
| 4 | Mask L1 (using thick dry film or high tack dicing tape) bridge over cavity created by wall |
| 5 | Immersion Sri (100-250 µ-in) |
| 6 | Remove Mask on L1 |

While specific embodiments have been illustrated and described, numerous modifications come to mind without significantly departing from the spirit of the invention, and the scope of protection is only limited by the scope of the accompanying claims.

What is claimed is:

1. A surface mountable package for containing a transducer, the transducer being responsive to sound pressure levels of an acoustic signal to provide an electrical output representative of the acoustic signals, the surface mountable package comprising:
   at least a first member and a second member and a chamber being defined by the first member and the second member, the transducer being attached to a surface formed on one of the first member or the second member and the transducer residing within the chamber;
   the surface being formed with at least one patterned conductive layer, the patterned conductive layer being electrically coupled to the transducer; an outside surface of the surface mountable package comprising a plurality of terminal pads electrically coupled to the patterned conductive layer;
   a volume being defined by the transducer and one of the first member or the second member, the volume being acoustically coupled to the transducer; and
   one of the first member or the second member being formed to include an aperture, the aperture configured to permit the passage of an acoustic signal to the transducer.

2. The surface mountable package of claim 1, wherein the first member comprises a substrate and the second member comprises a cover coupled to the substrate to define the chamber.

3. The surface mountable package of claim 1, the volume includine a recess formed in the surface.

4. The surface mountable package of claim 1, the volume including a hole through one of the first member or the second member containing the surface.

5. The surface mountable package of claim 1, the surface mountable package being secured to a substrate of a device, the chamber in communication with a cavity formed in the device substrate.

6. The surface mountable package of claim 1, the aperture being acoustically coupled to a first side of the transducer and the volume being acoustically coupled to a second side of the transducer.

7. The surface mountable package of claim 1, the aperture being formed in the respective one of the first member and the second member, the surface being formed on the respective one of the first member and the second member and the transducer being attached to the surface completely covering the aperture.

8. The surface mountable package of claim 1, the aperture being formed in the respective one of the first member and the second member, the surface being formed on the respective one of the first member and the second member and the transducer being attached to the surface adjacent to the aperture.

9. The surface mountable package of claim 1, the aperture being formed in the respective one of the first member and the second member, the surface being formed on the respective one of the first member and the second member and the aperture is acoustically coupled by the chamber to the transducer.

10. The surface mountable package of claim 1, the aperture is formed in the respective one of the first member and the second member, the surface is formed on the respective one of the first member and the second member and the transducer is attached to the surface leaving the aperture uncovered by the transducer, wherein the aperture is coupled to the transducer via the chamber.

11. The surface mountable package of claim 1, the aperture is formed in each of the first member and the second member.

12. The surface mountable package of claim 1, the aperture is formed in the second member, the surface is formed on the first member and the aperture is coupled to the transducer via the chamber; and the volume includes a recess formed in the first member.

13. The surface mountable package of claim 1, the aperture is formed in the respective one of the first member and the second member, the surface is formed on the respective one of the first member and the second member and the transducer is attached to the surface covering the aperture and a sealing ring is disposed about and surrounding the aperture, the sealing ring providing a seal between the transducer and the surface.

14. The surface mountable package of claim 1, the surface mountable package being secured to a surface of a device, a sealing ring disposed about and surrounding the aperture on an outside surface of the surface mountable package, the sealing ring providing a seal between the surface mountable package and the surface of the device.

15. The surface mountable package of claim 1, the patterned conductive layer comprising a plurality of terminal pads, the terminal pads providing an electrical connection between the transducer within the volume and an exterior of the surface mountable package.

16. The surface mountable package of claim 1, a metalized region being formed on an exterior surface of the surface mountable package, the metalized region being electrically coupled to the patterned conductive layer.

17. The surface mountable package of claim 1, one or both of the first member and the second member including a shield against electromagnetic interference.

18. The surface mountable package of claim 1, the first member including a first conductive portion, the second member including a second conductive portion, an electromagnetic interference shield being formed by the coupling of the first conductive portion and the second conductive portion.

19. The surface mountable package of claim 18, the first conductive portion comprising a conductive layer formed in the first member and the second conductive portion comprising a conductive layer formed in the second member.

20. The surface mountable package of claim 1, the first member comprising a printed circuit board.

21. The surface mountable package of claim 1, a third member being disposed between the first member and the second, the first member, the second member and the third member defining the chamber.

22. The surface mountable package of claim 1, a barrier being disposed within the aperture.

23. The surface mountable package of claim 22, wherein the barrier has acoustic properties.

24. The surface mountable package of claim 23, wherein the barrier forms an environmental protective barrier.

25. The surface mountable package of claim 1, the aperture being formed in the respective one of the first member and the second member, the surface being formed on the respective other one of the first member and the second member, the aperture being coupled to the transducer via the chamber and a passage being formed in the respective other one of the first member and the second member, the passage being coupled to the transducer.

26. The surface mountable package of claim 25, wherein the passage comprises a portion of an acoustic port.

27. The surface mountable package of claim 25, wherein a barrier is disposed within the passage.

28. The surface mountable package of claim 1, wherein the volume includes a portion of the chamber.

29. The surface mountable package of claim 1, wherein the acoustic signal is coupled to the transducer via the chamber.

* * * * *

UNITED STATES PATENT AND TRADEMARK OFFICE
CERTIFICATE OF CORRECTION

PATENT NO. : 7,242,089 B2
APPLICATION NO. : 11/112043
DATED : July 10, 2007
INVENTOR(S) : Anthony D. Minervini It is certified that error appears in the above-identified patent and that said Letters Patent is hereby corrected as shown below:

On the title page:

Item (*), add "This patent is subject to a terminal disclaimer."

Signed and Sealed this

Eighth Day of January, 2008

JON W. DUDAS
*Director of the United States Patent and Trademark Office*

INTER PARTES REEXAMINATION CERTIFICATE (835th)
United States Patent
Minervini

(10) Number: US 7,242,089 C1
(45) Certificate Issued: *Mar. 5, 2014

(54) MINIATURE SILICON CONDENSER MICROPHONE

(75) Inventor: Anthony D. Minervini, Palos Hills, IL (US)

(73) Assignee: JPMorgan Chase Bank, New York, NY (US)

Reexamination Request:
No. 95/000,515, Nov. 4, 2009

No. 95/000,513, Dec. 14, 2009

Reexamination Certificate for:
Patent No.: 7,242,089
Issued: Jul. 10, 2007
Appl. No.: 11/112,043
Filed: Apr. 22, 2005

Certificate of Correction issued Jan. 8, 2008

( * ) Notice: This patent is subject to a terminal disclaimer.

Related U.S. Application Data

(62) Division of application No. 09/886,854, filed on Jun. 21, 2001, now Pat. No. 7,166,910.

(60) Provisional application No. 60/253,543, filed on Nov. 28, 2000.

(51) Int. Cl.
    *H01L 23/12* (2006.01)
    *H04R 9/08* (2006.01)

(52) U.S. Cl.
    USPC ............ 257/704; 257/724; 381/355; 381/361

(58) Field of Classification Search
    USPC ........................................................ 257/704
    See application file for complete search history.

(56) References Cited

To view the complete listing of prior art documents cited during the proceedings for Reexamination Control Numbers 95/000,515 and 95/000,513, please refer to the USPTO's public Patent Application Information Retrieval (PAIR) system under the Display References tab.

*Primary Examiner* — Leonardo Andujar

(57) ABSTRACT

A silicon condenser microphone package includes a transducer unit, a substrate, and a cover. The substrate includes an upper surface transducer unit is attached to the upper surface of the substrate and overlaps at least a portion of the recess wherein a back volume of the transducer unit is formed between the transducer unit and the substrate. The cover is placed over the transducer unit and either the cover or the substrate includes an aperture.

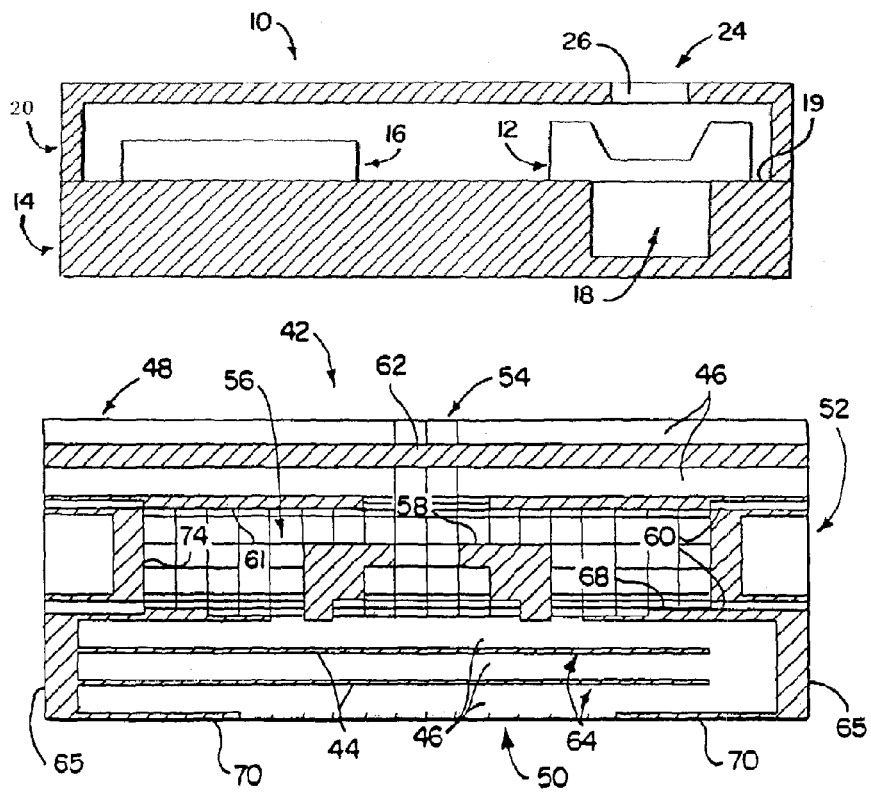

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

The patentability of claim 5 is confirmed.

Claims 1-4 and 6-29 are cancelled.

\* \* \* \* \*

(12) EX PARTE REEXAMINATION CERTIFICATE (10094th)
United States Patent
Minervini

(10) Number: US 7,242,089 C2
(45) Certificate Issued: *Apr. 2, 2014

(54) MINIATURE SILICON CONDENSER MICROPHONE

(76) Inventor: Anthony D. Minervini, Palos Hills, IL (US)

Reexamination Request:
No. 90/009,739, May 5, 2010

Reexamination Certificate for:
Patent No.: 7,242,089
Issued: Jul. 10, 2007
Appl. No.: 11/112,043
Filed: Apr. 22, 2005

Reexamination Certificate C1 7,242,089 issued Mar. 5, 2014

Certificate of Correction issued Jan. 8, 2008

(*) Notice: This patent is subject to a terminal disclaimer.

Related U.S. Application Data

(62) Division of application No. 09/886,854, filed on Jun. 21, 2001, now Pat. No. 7,166,910.

(60) Provisional application No. 60/253,543, filed on Nov. 28, 2000.

(51) Int. Cl.
*H01L 23/12* (2006.01)
*H04R 9/08* (2006.01)

(52) U.S. Cl.
USPC ............ 257/704; 257/724; 381/355; 381/361

(58) Field of Classification Search
None
See application file for complete search history.

(56) References Cited

To view the complete listing of prior art documents cited during the proceeding for Reexamination Control Number 90/009,739, please refer to the USPTO's public Patent Application Information Retrieval (PAIR) system under the Display References tab.

*Primary Examiner* — Leonardo Andujar

(57) ABSTRACT

A silicon condenser microphone package includes a transducer unit, a substrate, and a cover. The substrate includes an upper surface transducer unit is attached to the upper surface of the substrate and overlaps at least a portion of the recess wherein a back volume of the transducer unit is formed between the transducer unit and the substrate. The cover is placed over the transducer unit and either the cover or the substrate includes an aperture.

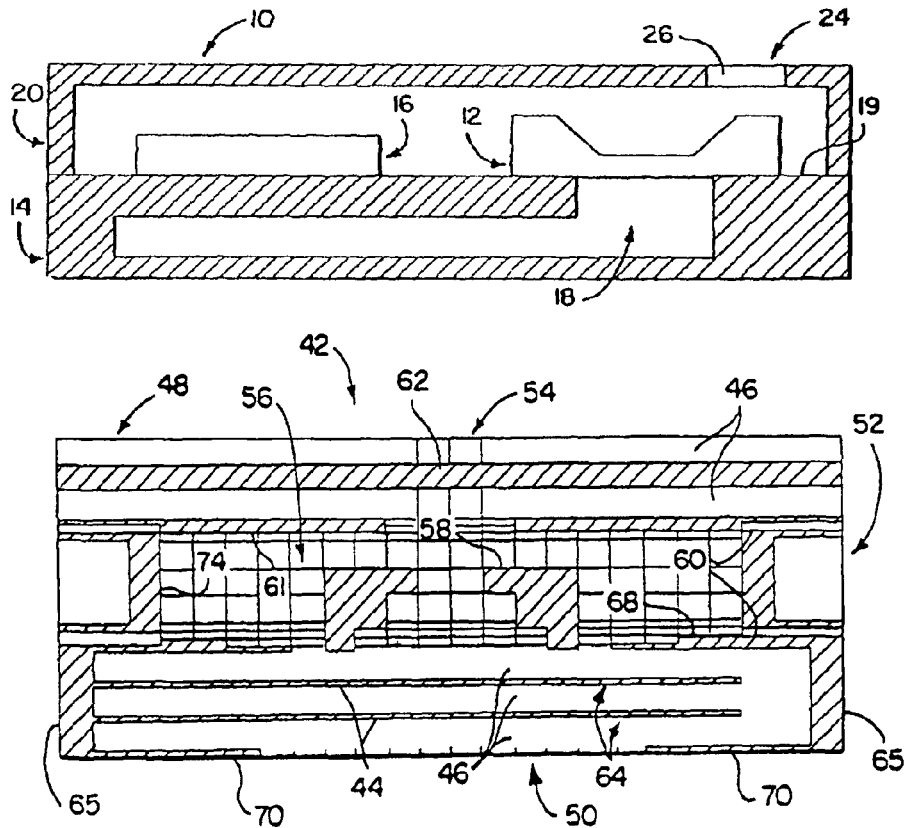

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-4 and 6-29 were previously cancelled.

New claims 30-61 are added and determined to be patentable.

Claim 5 was not reexamined.

*30. A surface mountable package for a MEMS microphone, comprising:*
*a planar substrate of the package comprising (a) a single planar upper surface comprising a patterned conductive layer, (b) a single planar lower surface comprising a plurality of solder pads electrically coupled to the patterned conductive layer, and (c) a layer of non-conductive printed circuit board material, where the patterned conductive layer is positioned substantially above the plurality of solder pads;*
*a side portion of the package comprising (a) side walls on the perimeter of the side portion and (b) a routed window on the interior of the side portion, where the bottom of the side portion is directly coupled to the upper surface of the substrate;*
*a package cover directly coupled to the top of the side portion;*
*a chamber being defined by the substrate, side portion, and cover, the side portion forming the internal height of the chamber;*
*a MEMS microphone electrically coupled to the patterned conductive layer and physically attached to the upper surface of the substrate within the chamber;*
*a volume defined by the MEMS microphone and the substrate, the volume being acoustically coupled to the MEMS microphone; and*
*an aperture located in either the cover or substrate and configured to permit the passage of an acoustic signal to the MEMS microphone.*

*31. The surface mountable package of claim 30 further comprising an integrated circuit attached to the upper surface of the substrate and positioned adjacent to the MEMS microphone.*

*32. The surface mountable package of claim 30 where the aperture is located in the cover.*

*33. The surface mountable package of claim 30 where the aperture is located in the substrate adjacent to the MEMS microphone.*

*34. The surface mountable package of claim 30 where the aperture is located in the substrate directly beneath the MEMS microphone.*

*35. The surface mountable package of claim 30 where the substrate includes a cavity formed in the substrate beneath the MEMS microphone and acoustically coupled to the MEMS microphone.*

*36. A surface mountable package for containing a MEMS microphone die, the surface mountable package comprising:*
*a first member having a rectangular shape and comprising a planar upper surface, a planar lower surface, and edge surfaces,*
*wherein the upper surface has an interior area, and a peripheral area that completely surrounds the interior area and is interposed between the edge surfaces and the interior area,*
*wherein a patterned conductive layer is formed on the upper surface of the first member, and a plurality of terminal pads are formed on the lower surface of the first member,*
*wherein the plurality of terminal pads are formed within a perimeter of the lower surface of the first member,*
*wherein electrical pathways disposed completely within the first member electrically couple one or more of the terminal pads to the patterned conductive layer, and*
*wherein the plurality of terminal pads are configured to mechanically and electrically couple the surface mountable package to a device substrate;*
*a second member comprising a planar upper surface, a planar lower surface, and edge surfaces, the second member having an opening formed in an interior area of the second member,*
*wherein the opening has conductively plated sidewalls that extend between the upper and lower surfaces of the second member, and*
*wherein the lower surface of the second member is attached to the peripheral area of the upper surface of the first member, and the opening of the second member leaves the interior area of the upper surface of the first member exposed;*
*a third member comprising an upper surface and a planar lower surface,*
*wherein a portion of the lower surface of the third member is attached to the upper surface of the second member,*
*wherein a portion of the upper surface of the first member, the sidewalls of the opening in the second member, and a portion of the lower surface of the third member cooperate to define a chamber, and*
*wherein the second member defines the height of the chamber;*
*a MEMS microphone die comprising a diaphragm and backplate, wherein the MEMS microphone die resides within the chamber, is disposed on the upper surface of the first member within the interior area, and is electrically coupled to the patterned conductive layer;*
*a volume defined within the chamber by the exterior surfaces of the MEMS microphone die, a portion of the upper surface of the first member, the sidewalls of the second member, and a portion of the lower surface of the third member, the defined volume being acoustically coupled to the diaphragm of the MEMS microphone die; and*
*an aperture formed in one of the first member or the third member, the aperture configured to permit the passage of acoustic pressure to the MEMS microphone die.*

*37. The surface mountable package of claim 36,*
*wherein the aperture is formed in the first member,*
*the defined volume within the chamber operating as a back volume for the MEMS microphone die, and*
*the MEMS microphone die is attached to the upper surface of the first member and completely covers the aperture.*

38. The surface mountable package of claim 36,
wherein the aperture is formed in the third member,
the defined volume within the chamber operating as a front volume for the MEMS microphone die, and a cavity in the MEMS microphone die operating as a back volume for the MEMS microphone die, and
the MEMS microphone die is attached to the upper surface of the first member.

39. The surface mountable package of claim 36,
wherein the aperture is formed in the first member, and
wherein the MEMS microphone die is attached to the upper surface of the first member at a position that does not cover the aperture in the first member,
wherein the aperture is acoustically coupled to the MEMS microphone die via the defined volume.

40. The surface mountable package of claim 36, wherein an aperture is formed in each of the first member and the third member.

41. The surface mountable package of claim 36,
wherein the aperture is formed in the first member,
wherein the MEMS microphone die is attached to the upper surface of the first member and covering the aperture, and
wherein the surface mountable package further comprises a sealing ring formed on the lower surface of the first member and surrounding the aperture.

42. The surface mountable package of claim 41, wherein the sealing ring provides a seal between an acoustic passage in the device substrate and the aperture in the first member.

43. The surface mountable package of claim 36,
wherein the aperture is formed in the first member, and
wherein the surface mountable package further comprises a sealing ring formed on the lower surface of the first member and surrounding the aperture.

44. The surface mountable package of claim 43, wherein the sealing ring provides an acoustic seal between the surface mountable package and an acoustic passage present in the surface of in the device substrate.

45. The surface mountable package of claim 36, wherein:
the first member further comprises a first conductive portion,
the second member further comprises a second conductive portion, and
the third member further comprises a third conductive portion,
wherein the first, second, and third conductive portions are electrically coupled to each other, and cooperate to form an electromagnetic interference shield.

46. The surface mountable package of claim 45,
the first conductive portion comprising a conductive layer formed in the first member,
the second conductive portion comprising a conductive layer formed in the second member, and
the third conductive portion comprising a conductive layer formed in the third member.

47. The surface mountable package of claim 36, wherein the first member comprises a printed circuit board material.

48. The surface mountable package of claim 36, a barrier being disposed within the aperture.

49. The surface mountable package of claim 48, wherein the barrier has acoustic properties.

50. The surface mountable package of claim 49, wherein the barrier forms an environmental protective barrier.

51. The surface mountable package of claim 36, further comprising an integrated circuit attached to the upper surface formed on the first member and positioned adjacent to the MEMS microphone die, wherein the integrated circuit is electrically coupled to the MEMS microphone die and the patterned conductive layer.

52. A surface mountable package for a MEMS microphone die, comprising:
a planar substrate comprising a plurality of layers of non-conductive material, wherein a planar upper surface is formed on the top layer of non-conductive material and a planar lower surface is formed on the bottom layer of non-conductive material, the substrate further comprising:
a patterned conductive layer formed on the upper surface of the substrate;
a plurality of solder pads formed within a perimeter of the lower surface of the substrate;
one or more electrical pathways encased within the substrate to electrically couple one or more of the plurality of solder pads to the patterned conductive layer, and
wherein the patterned conductive layer is positioned substantially above the plurality of solder pads with the substrate disposed therebetween;
a planar sidewall spacer of the package comprising a plurality of layers of non-conductive material, the sidewall spacer further comprising:
a window formed in the interior of the sidewall spacer, wherein the formed window has walls that extend between the upper and lower surfaces of the sidewall spacer; and
the formed window of the sidewall spacer leaves an area of the upper surface of the substrate uncovered when the bottom surface of the sidewall spacer is directly coupled to the upper surface of the substrate;
a planar cover directly coupled to the top surface of the sidewall spacer;
a chamber being defined by a portion of the upper surface of the substrate, the walls of the formed window of the sidewall spacer, and a portion of the cover, the sidewall spacer forming the internal height of the chamber;
a MEMS microphone die electrically coupled to the patterned conductive layer and attached to the upper surface of the substrate within the chamber;
a volume defined by the exterior surfaces of the MEMS microphone die, the walls of the formed window of the sidewall spacer, an interior portion of the package cover, and a portion of the upper surface of the substrate, the volume being acoustically coupled to the MEMS microphone die; and
an aperture located in either the cover or substrate and configured to permit the passage of acoustic pressure to the MEMS microphone die.

53. The surface mountable package of claim 52, further comprising an integrated circuit attached to the upper surface of the substrate and positioned adjacent to the MEMS microphone die.

54. The surface mountable package of claim 52, where the aperture is located in the package cover.

55. The surface mountable package of claim 52, where the aperture is located in the substrate adjacent to the MEMS microphone die.

56. The surface mountable package of claim 52, where the aperture is located in the substrate directly beneath the MEMS microphone die.

57. The surface mountable package of claim 52, where the substrate includes a cavity formed in the substrate beneath the MEMS microphone die and acoustically coupled to the MEMS microphone die.

58. The surface mountable package of claim 52,
wherein the aperture is formed in the substrate,
wherein the MEMS microphone die is attached to the upper surface of the substrate and covering the aperture, and
wherein the surface mountable package further comprises a sealing ring formed on the lower surface of the substrate and surrounding the aperture.

59. The surface mountable package of claim 58, wherein the sealing ring provides a seal between an acoustic passage in a user-device substrate and the aperture in the substrate.

60. The surface mountable package of claim 52,
wherein the aperture is formed in the substrate, and
wherein the surface mountable package further comprises a sealing ring formed on the lower surface of the substrate and surrounding the aperture.

61. The surface mountable package of claim 60, wherein the sealing ring provides an acoustic seal between the surface mountable package and an acoustic passage present in the surface of a user-device substrate.

\* \* \* \* \*